United States Patent
Patil et al.

(10) Patent No.: US 7,197,721 B2
(45) Date of Patent: Mar. 27, 2007

(54) WEIGHT COMPRESSION/DECOMPRESSION SYSTEM

(75) Inventors: Srinivas Patil, Austin, TX (US); Sandip Kundu, Austin, TX (US)

(73) Assignee: Intel Corporation, Santa Clara, CA (US)

(*) Notice: Subject to any disclaimer, the term of this patent is extended or adjusted under 35 U.S.C. 154(b) by 353 days.

(21) Appl. No.: 10/321,074

(22) Filed: Dec. 17, 2002

(65) Prior Publication Data
US 2004/0117710 A1 Jun. 17, 2004

(51) Int. Cl.
G06F 17/50 (2006.01)
(52) U.S. Cl. .......................... 716/1; 714/738; 714/739
(58) Field of Classification Search ............... 716/1, 716/4–6; 714/32–33, 738–739; 324/765
See application file for complete search history.

(56) References Cited

U.S. PATENT DOCUMENTS

| | | | | |
|---|---|---|---|---|
| 3,719,885 | A * | 3/1973 | Carpenter et al. | 714/739 |
| 4,316,222 | A * | 2/1982 | Subramaniam | 358/426.13 |
| 4,941,193 | A * | 7/1990 | Barnsley et al. | 382/249 |
| 5,612,963 | A * | 3/1997 | Koenemann et al. | 714/739 |
| 5,621,963 | A * | 4/1997 | Givler | 29/525.06 |
| 5,845,064 | A * | 12/1998 | Huggins | 714/33 |
| 6,041,429 | A * | 3/2000 | Koenemann | 714/738 |
| 6,253,165 | B1 * | 6/2001 | Malvar | 703/2 |
| 6,327,687 | B1 * | 12/2001 | Rajski et al. | 714/738 |
| 6,393,594 | B1 * | 5/2002 | Anderson et al. | 714/738 |
| 6,557,156 | B1 * | 4/2003 | Guccione | 716/17 |
| 6,662,327 | B1 * | 12/2003 | Rajski | 714/738 |
| 2002/0093356 | A1 * | 7/2002 | Williams et al. | 324/765 |

OTHER PUBLICATIONS

Touba, Nur A et al., "Bit-Fixing in Pseudorandom Sequences for Scan BIST", IEEE Transactions on Computer-Aided Design of Integrated Circuits and Systems, vol. 20, No. 4, Apr. 2001, 0278-0070. p. 545-555.

Chandra, Anshuman et al., "System-on-a-Chip Test-Data Compression and Decompression Architectures Based on Golomb Codes", IEEE Transactions on Computer-Aided Design of Integrated Circuits and Systems, vol. 20, No. 3, Mar. 2001, 0278-0070. p. 355-368.

Chandra, Anshuman et al., "Frequency-Directed Run-Length (FDR) Codes with Application to System-on-a-Chip Test Data Compression[1]", 1093-0167, © 2001 IEEE, p. 42-47.

Hamzaoglu, Ilker et al., "Reducing Test Application Time for Full Scan Embedded Cores". 8pgs.

* cited by examiner

*Primary Examiner*—Vuthe Siek
*Assistant Examiner*—Naum B. Levin
(74) *Attorney, Agent, or Firm*—Ram P. Yadav

(57) ABSTRACT

According to some embodiments, provided are a pseudo-random sequence generator to generate a pseudo-random sequence of data values, a decoder to receive compressed weight values and to generate decompressed weight values, and a weighting unit to receive the pseudo-random sequence of data values, to receive the decompressed weight values and to weight the pseudo-random sequence of data values based on the decompressed weight values.

18 Claims, 16 Drawing Sheets

| BUCKET | RUN | PREFIX | SUFFIX |
|---|---|---|---|
| | 1 | 0 | 00 |
| | 01 | | 01 |
| | 001 | | 10 |
| | 0001 | | 11 |
| | 000001 | 10 | 00 |
| | 0000001 | | 01 |
| | 00000001 | | 10 |
| | 000000001 | | 11 |
| | 0000000001 | 110 | 00 |
| | 00000000001 | | 01 |

| BUCKET | RUN | PREFIX | SUFFIX |
|---|---|---|---|
| | 1 | 0 | 0 |
| | 01 | | 1 |
| BUCKET | 001 | 10 | 00 |
| | 0001 | | 01 |
| | 00001 | | 10 |
| | 000001 | | 11 |
| BUCKET | 0000001 | 110 | 000 |
| | 00000001 | | 001 |
| | 000000001 | | 010 |
| | 0000000001 | | 011 |
| | 00000000001 | | 100 |

Prior Art
FIG. 3

| BUCKET | | | BUCKET | | | | BUCKET | | |
|---|---|---|---|---|---|---|---|---|---|
| RUN | PREFIX | SUFFIX | RUN | PREFIX | SUFFIX | | RUN | PREFIX | SUFFIX |
| b | w0 | 00b | XXXXb | w10 | 00b | | XXXXXXXb | w110 | 00b |
| Xb | | 01b | XXXXXb | | 01b | | XXXXXXXXb | | 01b |
| XXb | | 10b | XXXXXXb | | 10b | | | | |
| XXXb | | 11b | XXXXXXXb | | 11b | | | | |

| RUN | PREFIX | SUFFIX |
|---|---|---|
| b | w0 | 0b |
| Xb | | 1b |
| XXb | w10 | 00b |
| XXXb | | 01b |
| XXXXb | | 10b |
| XXXXXb | | 11b |
| XXXXXXb | w110 | 000b |
| XXXXXXXb | | 001b |
| XXXXXXXXb | | 010b |
| XXXXXXXXXb | | 011b |
| XXXXXXXXXXb | | 100b |

FIG. 11

WEIGHT COMPRESSION/DECOMPRESSION SYSTEM

BACKGROUND

A conventional integrated circuit (IC) may include millions of logic gates. The logic gates must be fabricated properly in order for the IC to operate as designed. Testing techniques have therefore developed to ensure that the logic gates of an IC have been properly fabricated and provide proper functioning to the IC.

According to some testing techniques, automatic test equipment (ATE) transmits test data to input pins of an IC, receives output from the IC, and determines whether the logic gates of the IC are functioning properly based on the output. The I/O speed and storage capacity of such test equipment is not suitable for use in conjunction with many modern ICs, including microprocessors and application-specific ICs. For example, the amount of test data needed to provide adequate fault coverage for modern ICs often exceeds ATE storage capacity. Additional storage capacity may be obtained by purchasing memory expansion modules or more advanced ATE, but this approach is often cost-prohibitive.

Even if ATE storage capacity is suitable for given test data, slow ATE I/O speeds result in long test times that increase as the amount of test data increases. The test speed is limited to the ATE I/O speed even if (as is usually the case) an IC under test is capable of processing the test data at much higher speeds. The long test times limit the number of ICs that can be tested in a given period and thereby limit IC production throughput.

The above problems may be addressed by limiting amounts of test data used to test an IC. Such an approach results in less effective testing and is usually unacceptable. Built-In Self Test (BIST) is another approach in which test data for an IC is embedded in test sequences generated by BIST hardware located on the IC.

FIG. 1 illustrates a common BIST architecture known as STUMPS (Self-Testing Using MISR [Multiple Input Signature Register] and Parallel SRSG [Shift Register Sequence Generator]). Architecture 1 includes Parallel Random Pattern Generator (PRPG) 2 and phase shifter 3 for generating pseudo-random test patterns. During a test, these test patterns are shifted into scan chains 4 through 7 of the IC in which architecture 1 is implemented. Outputs of scan chains 4 through 7 are received by XOR tree 8, which generates a test signature based on the outputs. MISR 9 receives the test signature and determines if the test was successful based thereon.

Although the conventional BIST approach reduces ATE storage and I/O constraints, conventional BIST is impractical due to signal constraints imposed by some IC designs. Moreover, BIST requires a large amount of test data in order to obtain adequate fault coverage. These drawbacks may be alleviated by weighting the pseudo-random test patterns based on the scan chains to which they will be applied. Weights appropriate for a particular scan chain may be determined using Automatic Test Pattern Generation (ATPG) techniques, but current BIST-based approaches are unable to satisfactorily store and apply the required weights. This deficiency is particularly pronounced in cases where a test pattern developed using ATPG requires specific bit values at specific positions in the test pattern.

Current encoding schemes are sometimes used to compress test data for ATE storage. The compressed data may be decompressed on an IC under test and shifted through its functional logic at a speed greater than the ATE I/O speed, thereby reducing required test time. One class of encoding schemes is referred to as run-length encoding. According to run-length encoding, a run consists of consecutive occurrences of a particular symbol or data value. A length of a run is equal to the number of consecutive occurrences.

Runs may be converted into code words according to the tables shown in FIGS. 2 and 3. As shown in the FIGS., each run corresponds to a prefix and a suffix that are concatenated to create a code word associated with the run. The prefix identifies the "bucket" to which the run belongs, and the suffix identifies the run within the identified bucket.

Table 10 of FIG. 2 represents a conventional Goulomb encoding scheme. Goulomb encoding uses a variable-length prefix followed by a fixed-length suffix. Each prefix identifies a bucket that includes $2^{suffix\_length}$ runs. In FIG. 3, table 20 illustrates another run-length encoding scheme. This scheme also uses a variable-length prefix to identify a bucket of runs, but the length of a suffix corresponding to a bucket is identical to the length of the prefix that identifies the bucket. In the table 20 scheme, each prefix of length k identifies a bucket that includes $2^k$ runs. For certain types of data, these conventional encoding schemes produce unsatisfactory compression ratios. Moreover, these schemes cannot be used to encode and decode certain types of data.

BRIEF DESCRIPTION OF THE DRAWINGS

FIG. 2 comprises a table illustrating a conventional Goulomb encoding scheme.

FIG. 3 comprises a table illustrating a conventional run-length encoding scheme.

FIG. 10 comprises a table illustrating a compression/decompression scheme according to some embodiments.

FIG. 11 comprises a table illustrating a compression/decompression scheme according to some embodiments.

DETAILED DESCRIPTION

Figure 1:
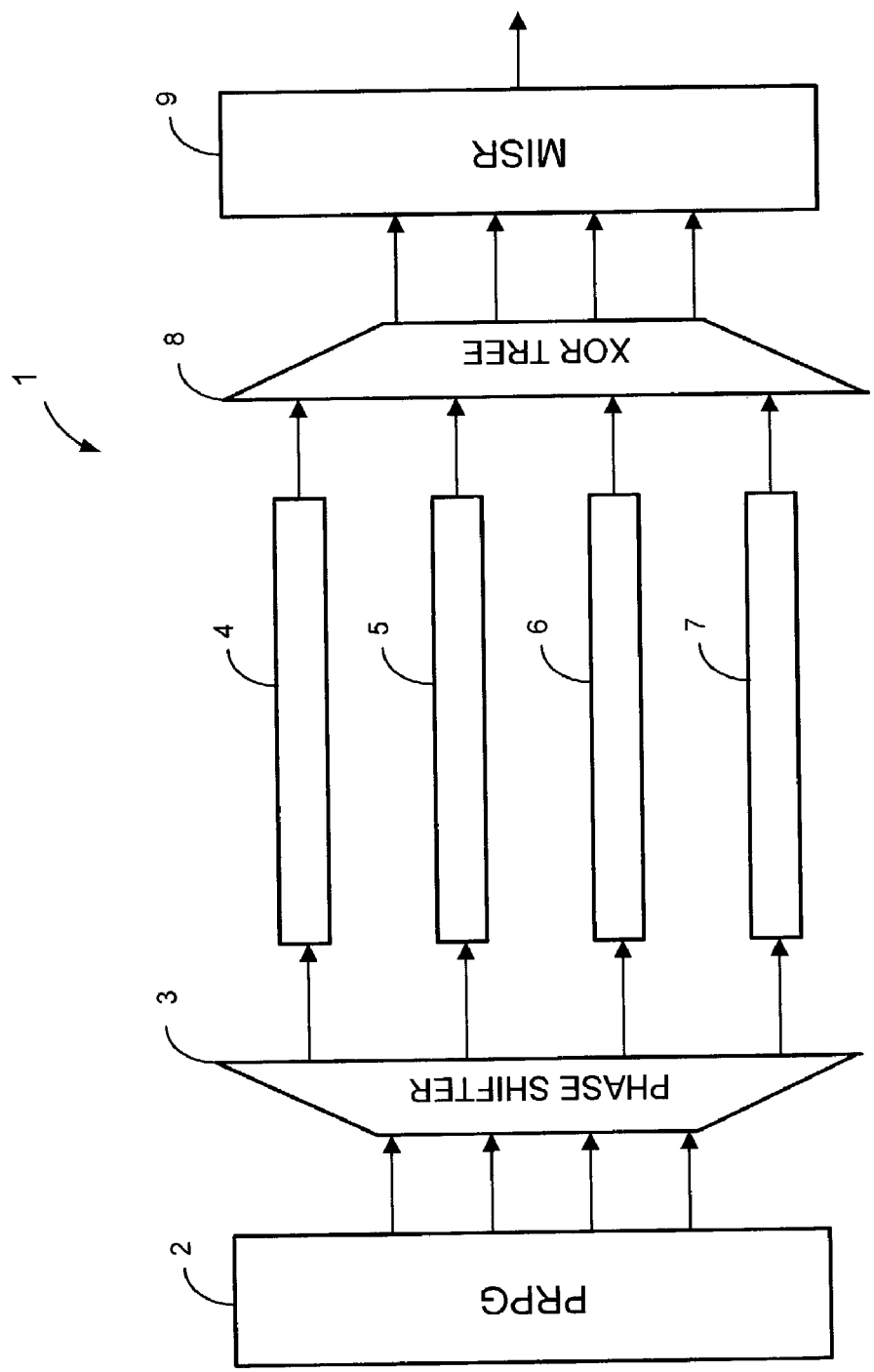
FIG. 1 is a diagram illustrating a conventional STUMPS architecture.
Figure 4:
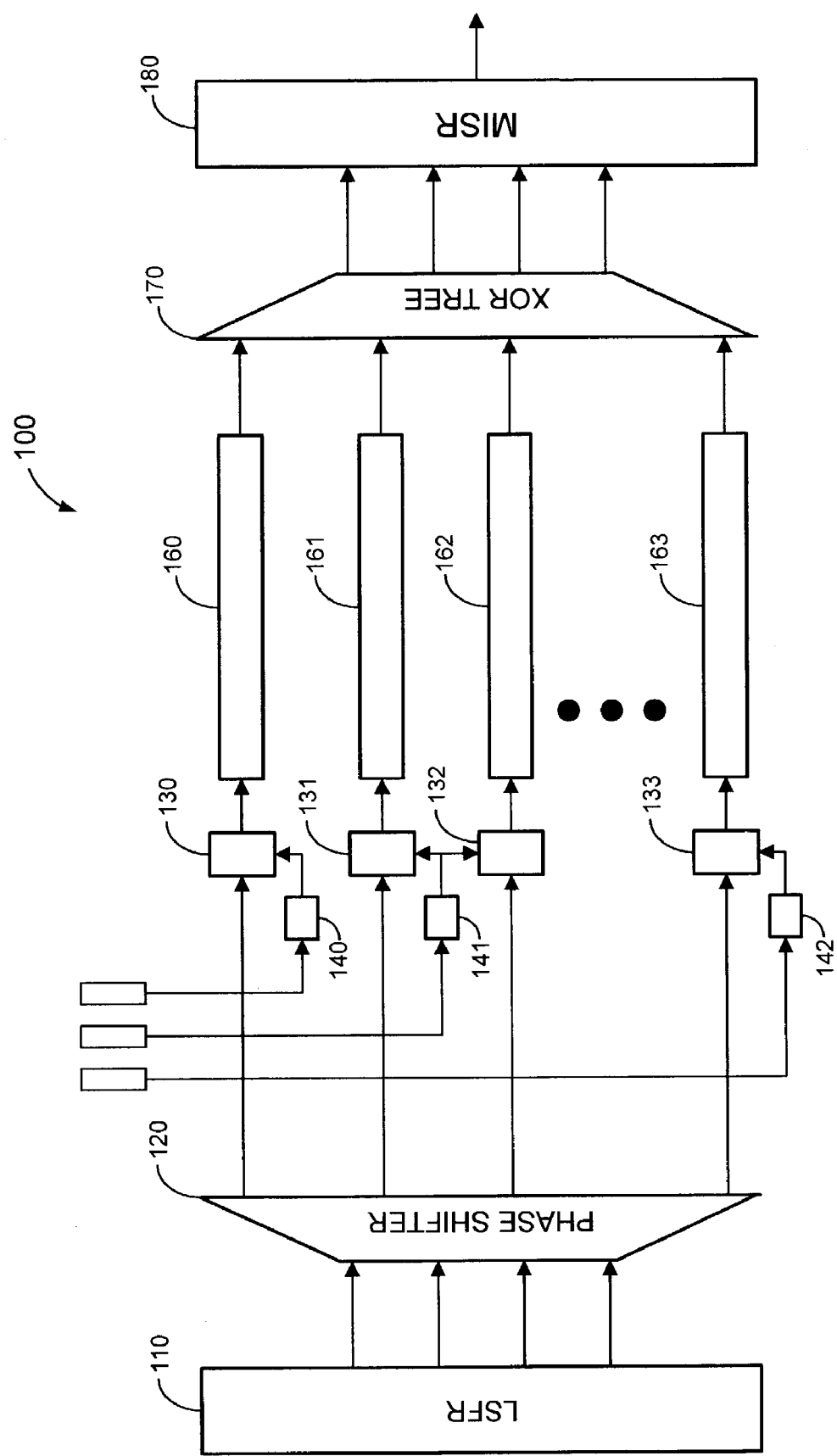
FIG. 4 is a block diagram of a testing architecture according to some embodiments.

FIG. 4 illustrates a circuit to decompress and apply weights to a pseudo-random sequence of data values according to some embodiments. The weighted data values may be applied to a scan chain in order to test functional logic associated with the scan chain.

Circuit 100 includes Linier Feedback Shift Register (LFSR) 110. LFSR 110 generates a pseudo-random sequence of data values and transmits the sequence to phase shifter 120. Although FIG. 4 shows four sequences transmitted from LFSR 110 to phase shifter 120, any number of individual sequences may be transmitted and some or all of the transmitted sequences may be identical to one another. Phase shifter 120 introduces a spread among the data values of a received sequence so as to increase a randomness of the sequence. Accordingly, both LFSR 110 and phase shifter 120 operate to generate a pseudo-random sequence of data values.

A pseudo-random sequence is received by each of weighting units 130 through 133. Each of weighting units 130 through 133 also receives decompressed weight values from one of decoders 140 through 142. According to FIG. 4, weighting unit 131 and weighting unit 132 both receive decompressed weight values from decoder 141. The decompressed weight values may comprise weights such as probabilities or the like. Alternatively, the weight values may comprise indices that are associated with actual weights by weighting units 130 through 133.

Decoders 140 through 142 generate the decompressed weight values based on compressed weight values received from inputs 150 through 152, respectively. The compressed weight values may be transmitted to inputs 150 through 152 from ATE memory and/or from memory located on the IC on which architecture 100 is implemented.

In operation, each of weighting units 130 through 133 receives a pseudo-random sequence of data values from phase shifter 120, receives decompressed weight values from one of decoders 140 through 142, and weights the sequence based on the weight values. The weighted sequence is then shifted serially through an associated one of scan chains 160 through 163. Each of scan chains 160 through 163 is associated with functional logic of the host IC and is intended to the weighted sequences to and read output from the associated functional logic.

In some embodiments, the weight values received by a weighting unit are determined based on a scan chain associated with the weighting unit. Known ATPG techniques may be used for such a determination.

XOR tree 170 receives output from scan chains 160 through 163 and consolidates the output to generate a test signature. The test signature is received by MISR 180, which determines whether the test was successful based on the test signature. According to known testing techniques, MISR 180 checks the received test signature against an expected test signature to determine whether the test was successful.

Figure 5:
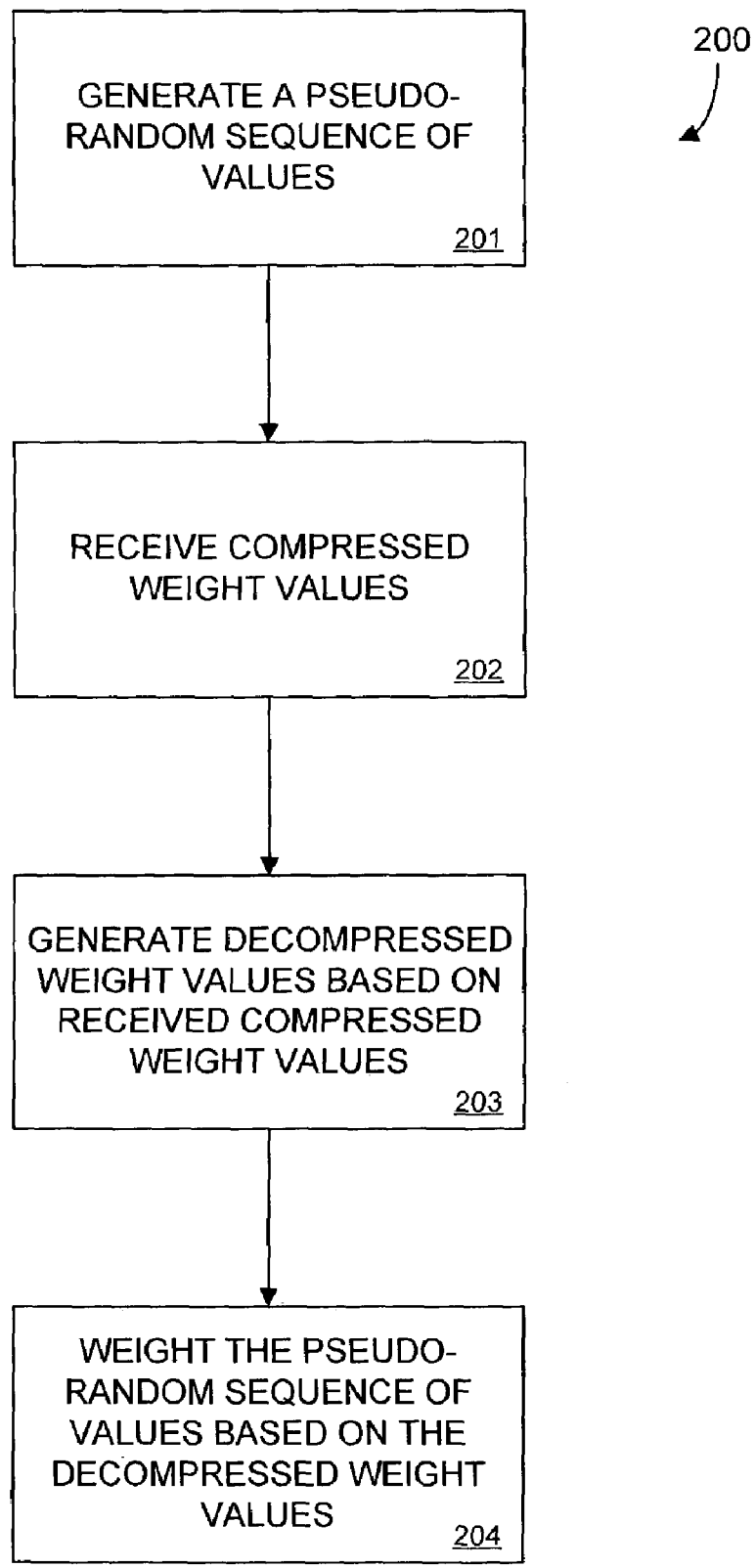
FIG. 5 is a flow diagram of process steps to generate scan patterns according to some embodiments.

FIG. 5 is a flow diagram of process steps 200 to generate scan patterns according to some embodiments. Process steps 200 may be executed by any configuration of any elements, including any combination of hardware, software and firmware. Process steps 200 will be described below with respect to specific elements of architecture 100.

Initially, in step 201, LFSR 110 and phase shifter 120 operate to generate a pseudo-random sequence of data values. In some embodiments, step 201 is performed without phase shifter 120. Next, in step 202, compressed weight values are received by decoder 140 from input 152. The compressed weight values are transmitted to input 152 by ATE (not shown) according to some embodiments.

Decoder 140 proceeds to generate decompressed weight values based on the received compressed weight values in step 203. In this regard, decoder 140 is designed to decompress the weight values based on a scheme by which the weight values were compressed. Finally, in step 204, weighting unit 130 receives the pseudo-random sequence of data values and the decompressed weight values from decoder 140, and weights the sequence based on the weight values.

Figure 6:
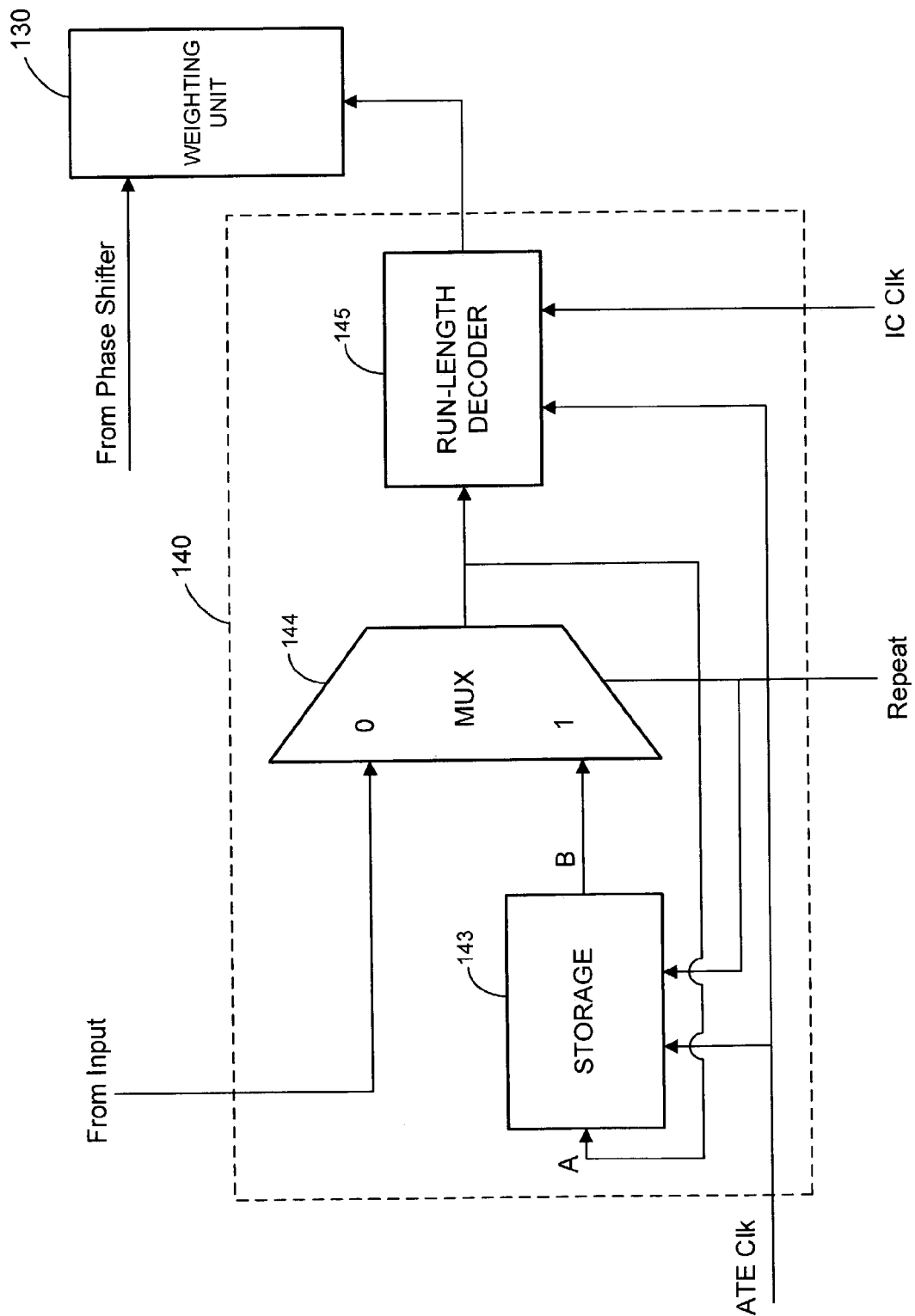
FIG. 6 is a block diagram of weighting logic according to some embodiments.

FIG. 6 is a block diagram of decoder 140 of architecture 100. FIG. 6 also illustrates weighting unit 130 and therefore will be used to describe steps 203 and 204 in more detail according to some embodiments. As shown, decoder 140 includes storage 143, MUX 144 and run-length decoder 145.

Storage 143 comprises a variable-length shift register to store compressed weight values received by decoder 140. Under conditions described below, storage 143 shifts the stored weight values to run-length decoder 145. Compressed weight values stored by storage 143 may be of variable lengths. To properly shift out any length of stored compressed weights, in some embodiments a length of the variable-length shift register adapts to a length of the stored weight values.

Figure 7:
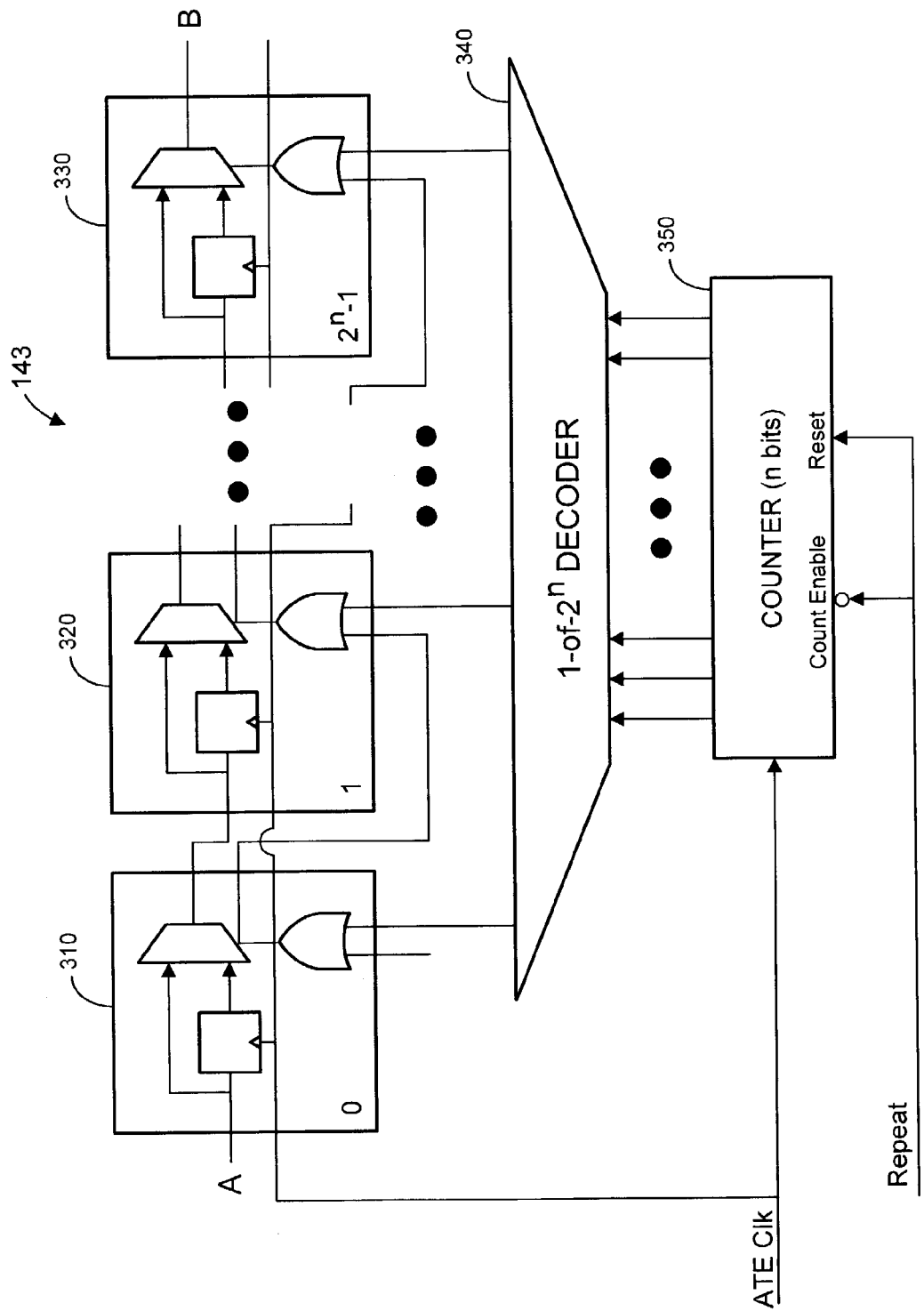
FIG. 7 is a block diagram of a variable-length shift register according to some embodiments.

FIG. 7 is a block diagram of storage 143 according to some embodiments. Storage 143 includes a plurality of shift register cells 310 through 330. Although three shift register cells are illustrated, storage 143 includes one shift register cell for each bit of a maximum number of bits storable by storage 143. Each of shift register cells 310 through 330 includes an OR gate to receive a bypass signal from decoder 340. If the bypass signal received by a particular shift register cell is 1, the particular shift register cell and each shift register cell to the right of the particular shift register cell are short-circuited. As a result, the shift register cell to the left of the particular shift register cell is effectively coupled directly to an output of storage 143.

In operation, counter 350 is reset when the Repeat signal transitions from 1 to 0. At each rising edge of the ATE clk signal, a bit of compressed weights are shifted into storage 143 at input A and counter 350 increments a count by one. Counter 350 thereby counts a number of bits stored within storage 143. Decoder 340 determines the count c from the output of counter 350 and transmits an active bypass signal to the (c+1)th shift register cell, counting from the right of FIG. 7.

When the Repeat signal becomes 1, counter 350 ceases counting and decoder holds its output bypass signals at their previous state. A length of storage 143 is therefore effectively reduced to the count c at the time the Repeat signal becomes 1. Therefore, upon reception of the ATE clk signal, a bit stored in the cth shift register cell of storage 143 is shifted directly to MUX 144.

MUX 144 includes inputs for receiving compressed weight values from input 152 and from storage 143. One of these inputs is selected for output based on a state of a Repeat control signal. In a case that the Repeat control signal is 0, the output of MUX 144 consists of the compressed weight values from input 152 and run-length decoder 145 generates decompressed weight values based thereon (step 203). As the output of MUX 144 is also coupled to an input of storage 143, these compressed values are also concurrently stored in storage 143.

In a case that the Repeat signal is 1, the input of run-length decoder 145 is coupled to the output of storage 143. Accordingly, run-length decoder 145 decodes previously-decoded and stored compressed weights. Since the output of storage 143 is connected to its input in this case, storage 143 becomes a re-circulating shift register that repeatedly shifts a same set of stored compressed weights to run-length decoder 145. Such an arrangement allows re-use of test data and therefore may significantly decrease a required test data storage capacity.

Externally-connected ATE need only apply the ATE clk signal while the Repeat signal is 1 so as to shift the compressed weights to run-length decoder 145. As shown, run-length decoder 145 generates the decompressed weight values based on an IC clk signal. The ATE clk signal may be significantly slower than the IC clk signal in a case that the weight value compression ratio is high. Moreover, the weighted data values generated by weighting unit 130 may be shifted through scan chain 160 using the IC clk signal, resulting in faster testing than if the data values were shifted through scan chain 160 based on the ATE clk signal. Known elements may be used to synchronize the ATE clk and IC clk signals.

As described above, weighting unit 130 may weight a sequence of data values received from phase shifter 120 in step 204 based on decompressed weight values received from run-length decoder 145. As mentioned above, the weight values may comprise actual weights such as probabilities or other values indicative of weights, such as indices. For the present example, it is assumed that the compressed weight values are indices to stored probabilities.

Figure 8:
FIG. 8 is a tabular representation of a weight table according to some embodiments.

FIG. 8 is a tabular representation of weight table 135 of weighting unit 130. Weight table 135 associates weight values, or indices in the present example, with respective ones of a plurality of probabilities. The indices are two-bit binary values, and the probabilities are represented as probabilities that a given bit in a test pattern will be a 0 or a 1. Accordingly, in step 204, a two-bit decompressed weight value is received from decoder 140, weighting unit determines a probability from table 135 based on the weight value, the probability is applied to a data value received from phase shifter 120, and the resulting weighted data value is shifted to scan chain 160. This process then repeats for a next two-bit decompressed weight value received from decoder 140 and a next data value received from phase shifter 120. Of course, other weighting techniques may be used in conjunction with some embodiments.

Figure 9:
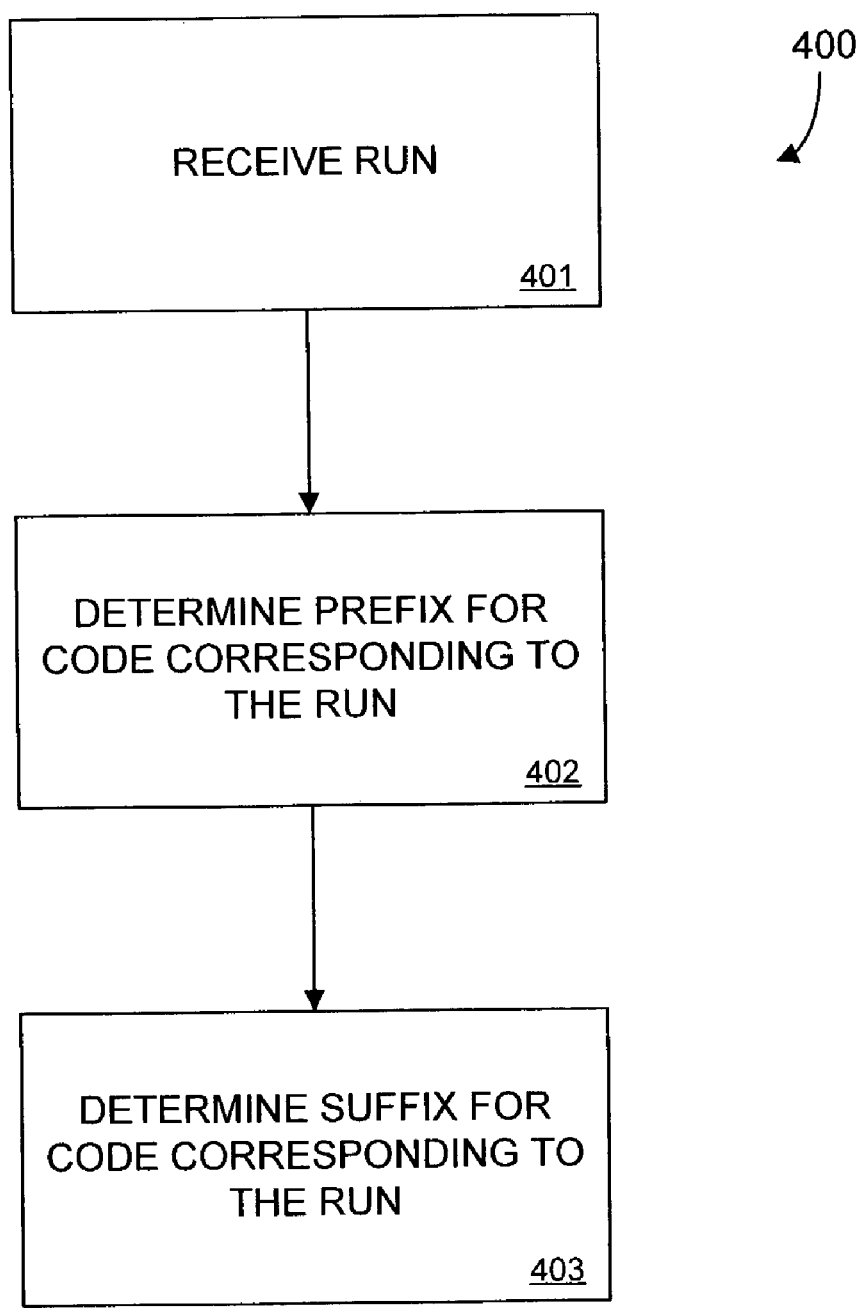
FIG. 9 is a flow diagram of process steps to compress data according to some embodiments.

Some embodiments have been described above without reference to a particular scheme for compressing and decompressing weight values. Although any scheme may be used, FIG. 9 presents a flow diagram of process steps 400 to compress data according to some embodiments. In some embodiments, process steps 400 are performed by a device that performs ATPG for an IC hosting architecture 100.

Initially, a run of one or more data values is received in step 401. The run consists of a number of consecutive instances of a first data value and is terminated by a second data value. A length of a run is equal to the number of consecutive instances of the first data value. In the present example, it will be assumed that the first data value is a weight value and the second data value is a 0 or a 1. Such runs are typical in test patterns generated by ATPG programs that employ weighted random pattern generation.

In step 402, a prefix of a code corresponding to the run is determined. The prefix comprises a third data value that identifies the first data value and a fourth data value that identifies a plurality of run lengths. Table 500 of FIG. 10 may be used to determine a prefix according to some embodiments. The X's in table 500 represent the first data value and the variable b represents the second data value. The third data value is represented by w and the fourth data value includes the remaining bits of the illustrated prefixes. According to the present example, the third data value is an index to the first data value. More particularly, the first data value is a weight and w may be a binary index identifying the weight. For W possible weights, a width of value w is equal to ceil($\log_2$W).

The fourth data value identifies the several run lengths of a bucket corresponding to the fourth data value. For example, the fourth data value "10" identifies run lengths of four, five, six and seven. Accordingly, the number of consecutive instances of X's in a run determines the fourth data value of a prefix corresponding to the run. The previous statement also holds true for the encoding scheme illustrated in table 600 of FIG. 11, although the buckets of table 600 are not of fixed size as in FIG. 10.

A suffix corresponding to the run is determined in step 403. The suffix includes a fifth data value that identifies a particular run length of the plurality of run lengths identified by the fourth data value. As shown in tables 500 and 600, the suffix may also include a sixth data value that identifies the second data value terminating the run. The sixth data value may therefore indicate a fixed value, rather than a weight, present within the scan pattern. The sixth data value may be equal to, a complement of, or otherwise indicative of the second data value. The determined prefix and suffix are concatenated to produce a code word corresponding to the run. Process steps 400 may then return to step 401, at which a next run of the test pattern is received.

Process steps 400 may operate differently than described above. In particular, process steps 400 may be used to compress data other than weight values. For example, process steps 400 may be used to compress runs of consecutive 0's and/or 1's, which may represent any information. Such compression is performed in some embodiments by establishing that the w value of the prefix identifies the value X of the encoded run. In some examples, a prefix corresponding to a run of 0's begins with a 0 while in other examples, a run of 0's corresponds to a prefix of 1.

An implementation of run-length decoder 145 and weighting unit 130 according to some embodiments will now be described. The implementation assumes that the received weights may only include an equiprobable weight, or 50/50. Using the scheme of table 500, a width of value w=ceil($\log_2$(1))=0. Accordingly, the weight values (50/50, 50/50, 50/50, 50/50, 1, 50/50, 50/50, 50/50, 0) would be compressed using process steps 400 to 100010110. Decoder 145 decompresses the compressed weights and outputs two bits to index a weight stored in weighting unit 130. Two bits are used because one index is required for the weight and two are required for the fixed values of 1 and 0. In the present example, 0 is indexed by 00, the weight 50/50 is indexed by 11 and 1 is indexed by 01.

Figure 12:
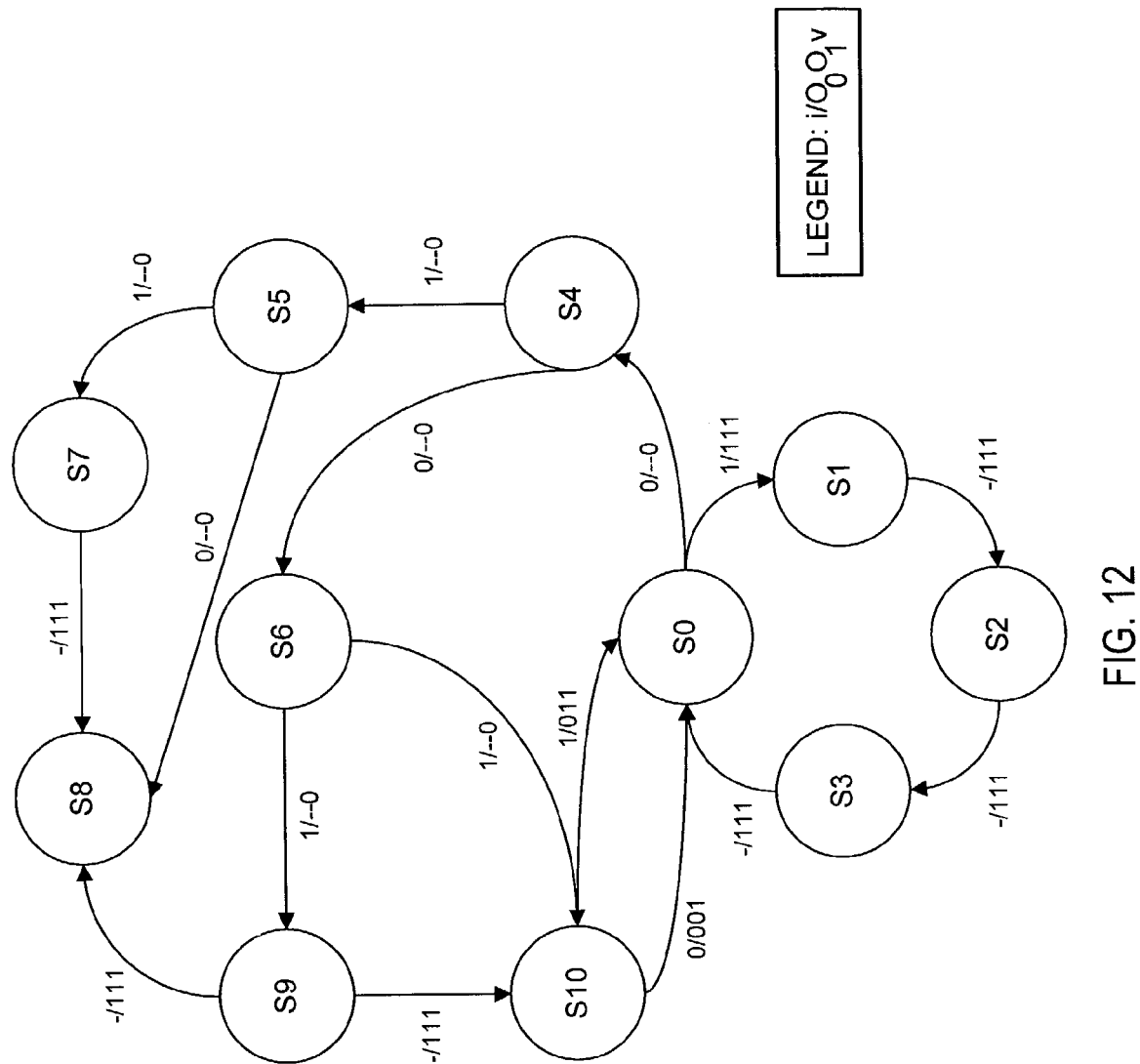
FIG. 12 is an example of a state diagram according to some embodiments.

Due to the variable length of the decompressed weights, decoder 145 may not always transmit a valid value with each cycle of the IC clk signal. A valid bit may therefore be used to indicate that the output of decoder 145 is valid. FIG. 12 illustrates a state diagram of decoder 145, where i is an input bit to decoder 145, $O_0O_1$ is a weight index output by decoder 145, and v is the aforementioned valid bit. A decoder operating in accordance with the FIG. 12 state diagram may require only eleven states or four flip-flops.

Figure 13:
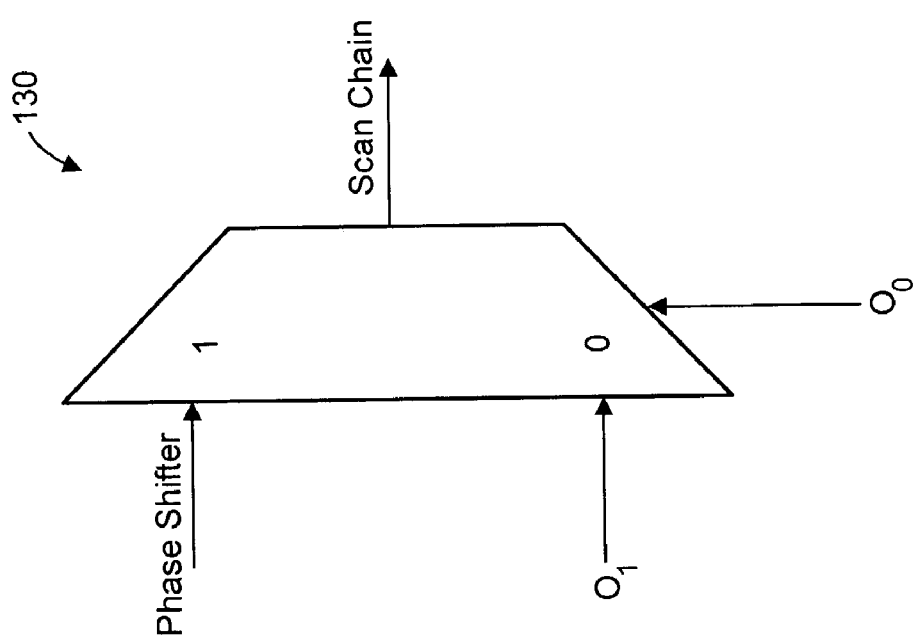
FIG. 13 is an example of a weighting unit according to some embodiments.

FIG. 13 illustrates weighting unit 130 according to the present example. As shown, weighting unit 130 of the present example may be implemented by a two input MUX. Examples using more complex sets of weights may require additional states to those shown in FIG. 12 and multiple Phase Shifter inputs to weighting unit 130.

Figure 14:
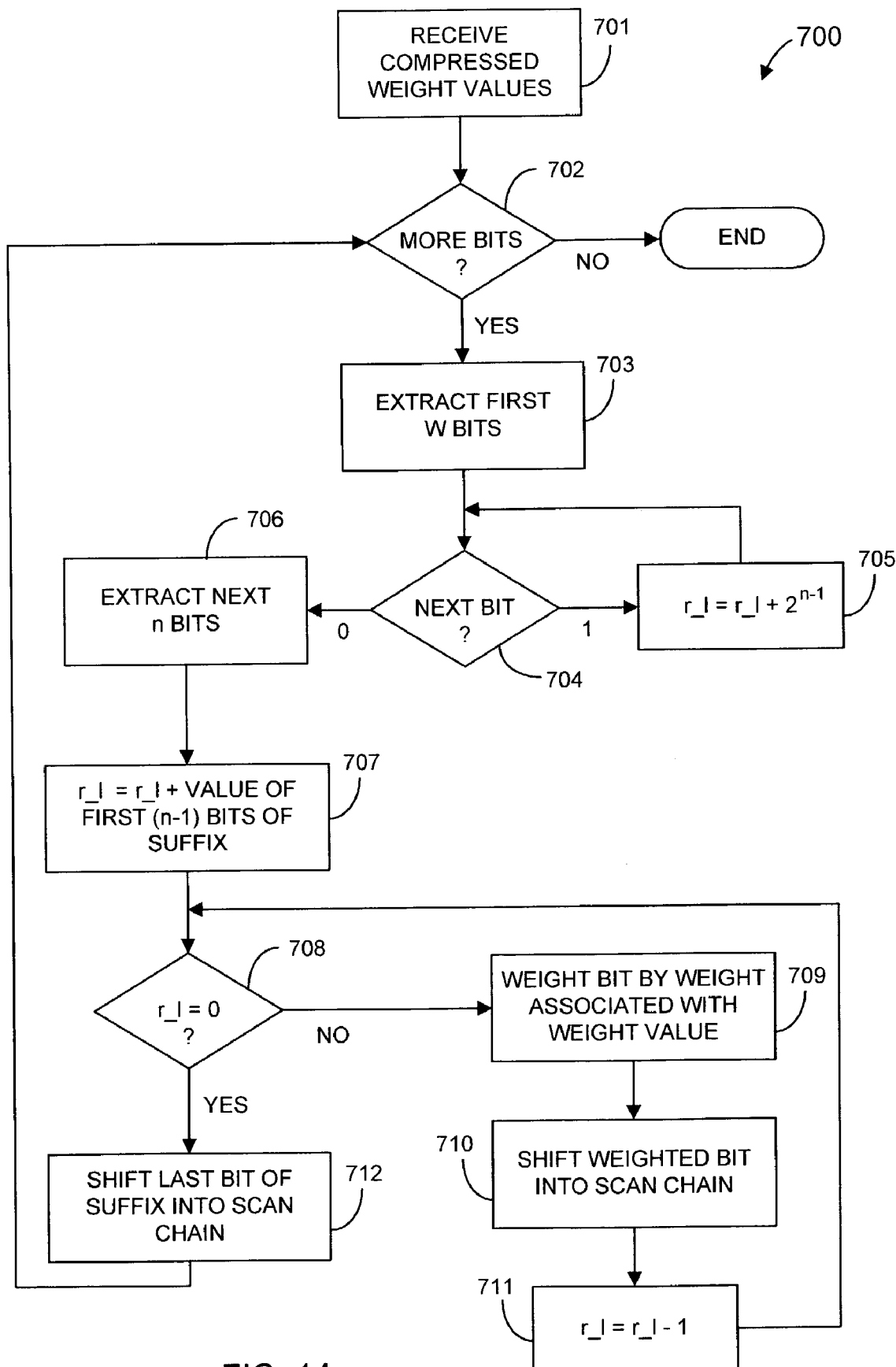
FIG. 14 is a flow diagram of process steps to generate weighted scan patterns from compressed weight values according to some embodiments.

FIG. 14 is a flow diagram of process steps 700 to decompress compressed weight values according to some embodiments of the invention, including some embodiments implementing the compression scheme of table 500. Process steps 700 may be performed according to some embodiments by hardware, firmware and/or software of decoder 140, or, more specifically, of run-length decoder 145, and/or weighting unit 130. Generally, process steps 700 may be performed by a system to decompress data that has been compressed according to the scheme reflected in table 500.

Prior to process steps 700, certain variables are initialized. Particularly, run_length=0, suffix length=n, and weight_value_length=W. As shown in table 500, a suffix length is fixed according to the compression scheme shown therein. This fixed length is equal to three in the scheme of table 500. W is equal to a length of a weight value. In a case that the compressed weight values are indices, W is equal to a number of bits in each index.

Compressed weight values are initially received in step 701. The compressed weight values may comprise a stream of binary data received from external ATE, from on-chip memory, or elsewhere. The compressed values may comprise a scan pattern that was generated using ATPG and that was thereafter compressed using process steps 400. As described above, the scan pattern may comprise a stream of weights interspersed with fixed bit values. Next, in step 702, it is determined whether any received bits remain to be decompressed. If not, process steps 700 terminate.

If bits remain to be decompressed, a first W bits are extracted from the received compressed weight values in step 703. Since W is equal to a length of a weight index, a weight index is extracted from the received compressed weight values in step 703.

A next bit is extracted from the compressed stream and is examined in step 704. If this next bit is a 1, table 500 indicates that the extracted bit is part of a prefix. Moreover, the prefix is associated with the second bucket shown in table 500. Since the prefix is associated with the second bucket, the run length of the compressed weight values must be equal to or greater than $2^{n-1}$. The variable run_length is therefore incremented by $2^{n-1}$ in step 705. Flow returns from step 705 to step 704.

Flow continues as described above between steps 704 and 705 as long as the bits subsequently examined in step 704 are equal to 1. Run_length is incremented by $2^{n-1}$ with each subsequently-examined bit that is equal to 1 so as to correspond to a minimum run length indicated by the current number of extracted prefix bits. Flow proceeds from step 704 to step 706 in a case that the examined bit is equal to 0, indicating the end of the prefix.

N bits are extracted in step 706. As defined above, n is equal to a predesignated suffix length. Accordingly, a suffix is extracted in step 706. The run_length variable is incremented in step 707 by the value of the first n−1 extracted suffix bits. The n−1 bits thereby indicate a specific run length among the $2^{n-1}$ runs associated with the previously-extracted prefix. The value of run_length after step 707 is equal to the length of the run encoded by the extracted prefix and suffix.

Next, in step 708, it is determined whether run_length=0. If not, a first bit received from Phase Shifter 120 is weighted according to the weight value extracted in step 703. In a case that the weight value is an index, a weight associated with the index may be determined in step 709. The weighted bit is shifted into scan chain 160 in step 710. Run_length is then decremented by one in step 711 and flow returns to step 708.

Flow cycles through steps 708 through 711 until run_length=0. Consequently, a number of bits equal to the originally-generated uncompressed run of weight values is weighted and applied to scan chain 160. Once run_length=0, the last bit of the suffix extracted in step 706 is shifted into scan chain 160 without effective weighting, under the assumption that the bit reflects a fixed value required by the uncompressed scan pattern of weight values. In some embodiments, fixed bit values may be represented in the uncompressed scan pattern using a same convention as other weight values (such as 100/0 shown in table 135). According to some of these embodiments, step 712 may be omitted, a suffix need not include variable b as shown in table 500, and a value of the full n-bit suffix is added to run_length in step 707.

Figure 15:
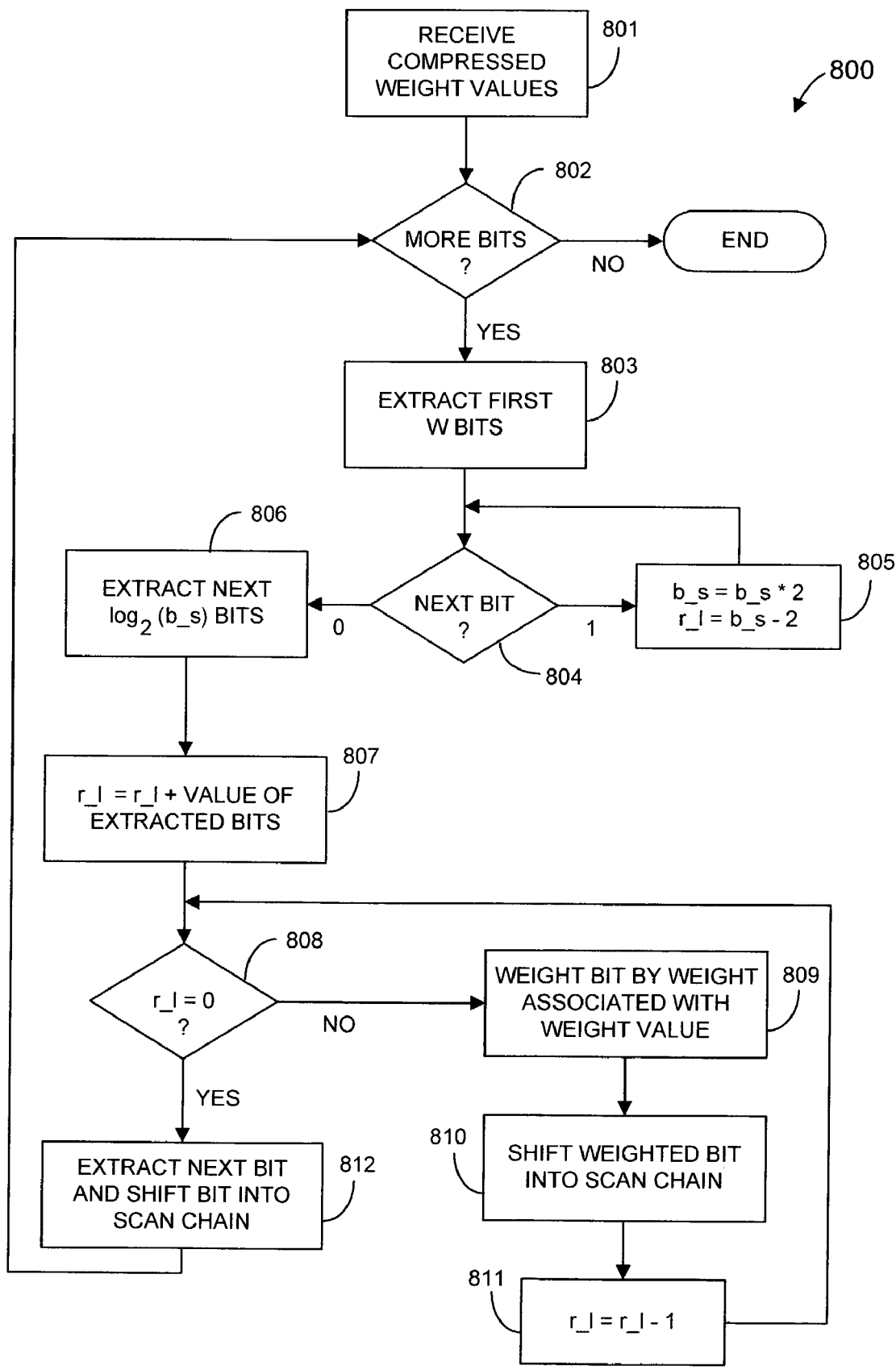
FIG. 15 is a flow diagram of process steps to generate weighted scan patterns from compressed weight values according to some embodiments.

FIG. 15 is a flow diagram of process steps 800 to decompress compressed weight values according to some embodiments of the invention, including some embodiments implementing the compression scheme of table 600. According to some embodiments, process steps 800 may be performed by hardware, firmware and/or software of decoder 140, run-length decoder 145, and/or weighting unit 130, and may be performed by a system to decompress data that has been compressed according to the scheme reflected in table 600.

Similarly to process steps 700, certain variables are initialized prior to step 801. The initialized values include: run_length=0, bucket_size=2, and weight_value_length=W. Bucket_size, as will be evident below, is equal to a number of different run lengths that are associated with a particular prefix. W is equal to a length of a weight value as described with respect to process steps 700.

Flow proceeds through steps 801 through 804 as described with respect to steps 701 through 704. If the bit examined in step 804 is a 1, the extracted bit is assumed to be part of a prefix other than the prefix associated with the first bucket of table 600. Since each bucket of table 600 is twice the size of the previous bucket, the variable bucket_size is multiplied by two in step 805. Moreover, the variable run_length is set equal to bucket_size−2, thereby indicating a shortest possible run length that could be associated with the prefix so far extracted.

Flow returns to step 804 and continues to step 806 in a case that the bit examined in step 804 is equal to 0. The suffix lengths of table 600 are not fixed and are therefore determined based on their relationships to their associated bucket sizes. This relationship is described by suffix length=$\log_2$(bucket_size). Accordingly, a next $\log_2$(bucket_size) bits of the compressed stream are extracted in step 806.

The run_length variable is incremented in step 807 by the value of the suffix bits extracted in step 806. The extracted bits thereby indicate a specific one of the (bucket_size) different run lengths associated with the previously-extracted prefix. Similarly to step 707, the value of run_length after step 807 is equal to the length of the run encoded by the extracted prefix and suffix.

It is then determined whether run_length=0 in step 808. If not, a first bit received from Phase Shifter 120 is weighted in step 809 according to the weight value extracted in step 803. If the weight value is an index, a weight associated with the index may also be determined in step 809. The weighted bit is shifted into scan chain 160 in step 810, run_length is then decremented by one in step 811, and flow returns to step 808.

Flow cycles through steps 808 through 811 as described above until run_length=0. A number of bits equal to the originally-generated uncompressed run of weight values is thereby weighted and applied to scan chain 160. If it is determined in step 808 that run_length=0, a next bit is extracted and is shifted into scan chain 160 without effective weighting. Again, it is assumed that the bit reflects a fixed value required by the uncompressed scan pattern of weight values. Moreover, fixed bit values may be represented in the uncompressed scan pattern using a same convention as other weight values. In such cases, step 812 may be omitted and a suffix need not include variable b as shown in table 600.

Figure 16:
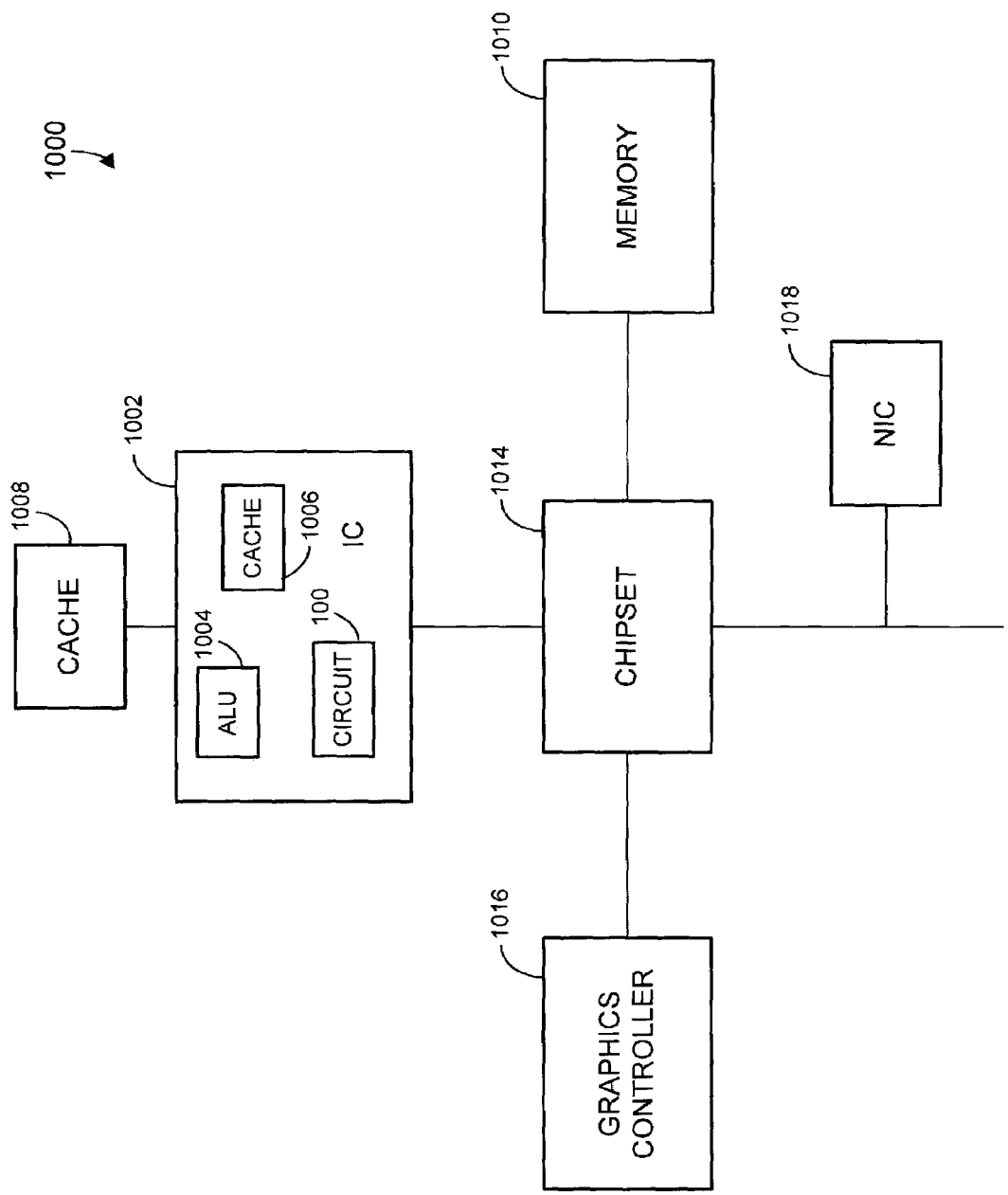
FIG. 16 is a block diagram of a system according to some embodiments.

FIG. 16 illustrates a block diagram of system 1000 according to some embodiments. System 1000 includes integrated circuit 1002 comprising sub-blocks such as circuit 100, arithmetic logic unit (ALU) 1004 and on-die cache 1006. Integrated circuit 1002 may be a microprocessor or another type of integrated circuit. According to some embodiments, integrated circuit 1002 also communicates with off-die cache 1008. Integrated circuit 1002 may also communicate with system memory 1010 via a host bus and chipset 1014. Other off-die functional units, such as graphics controller 1016 and Network Interface Controller (NIC) 1018, may communicate with integrated circuit 1002 via appropriate busses or ports.

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

What is claimed is:

1. A circuit comprising
   a pseudo-random sequence generator to generate a pseudo-random sequence of data values;
   a decoder to receive compressed weight values and to generate decompressed weight values; and
   a weighting unit to receive the pseudo-random sequence of data values, to receive the decompressed weight values and to weight the pseudo-random sequence of data values based on the decompressed weight values.

2. A circuit according to claim 1, wherein the decompressed weight values are indices.

3. A circuit according to claim 2, wherein weighting unit comprises a plurality of indices associated respective once of a plurality of probabilities.

4. A circuit according to claim 1, further comprising a scan chain to receive the weighted pseudo-random sequence of data values.

5. A circuit according to claim 4, further comprising:
   a second decoder to receive second compressed weight values and to generate second decompressed weight values;
   a second weighting unit to receive the pseudo-random sequence of data values, to receive the second decompressed weight values and to weight the pseudo-random sequence of data values based on the second decompressed weight values; and
   a second scan chain to receive the pseudo-random sequence of data values weighted based on the second decompressed weight values.

6. A circuit according to claim 5, wherein the pseudo-random sequence generator comprises a linear feedback shift register and a phase shifter;
   the circuit further comprising:
   a consolidation unit to receive output from the scan chain and the second scan chain and to generate a test signature; and
   a verification unit to determine if the test signature indicates a successful test.

7. A circuit according to claim 1, further comprising:
   a second weighting unit to receive the pseudo-random sequence of data values, to receive the decompressed weight values and to weight the pseudo-random sequence of data values based on the decompressed weight values; and
   a second scan chain to receive the pseudo-random sequence of data values weighted based on the decompressed weight values by the second weighting unit.

8. A circuit according to claim 7, further comprising:
   wherein the decompressed weight values are indices, wherein the weighting unit comprises a plurality of indices associated with respective once of a plurality of probabilities, and wherein second weighting unit comprises the plurality of indices associated with respective once of a second plurality of probabilities.

9. A circuit according to claim 7, wherein the decoder comprises storage to store compressed weight values.

10. A circuit according to claim 9, wherein the storage is a variable-length shift register.

11. A circuit according to claim 10, wherein the decoder comprises a run-length decoder to generate decompressed weight values, and wherein the variable-length shift register is to shift out the stored compressed weight values to the run length decoder in response to a control signal.

12. A method comprising:
    generating a pseudo-random sequence of data values;
    generating decompressed weight values based on received compressed weight values; and
    weighting the pseudo-random sequence of data values based on the decompressed weight values.

13. A method according to claim 12, further comprising:
    transmitting the pseudo-random sequence of data values weighted based on the decompressed weight values to a scan chain;
    generating second decompressed weight values based on second compressed weight values;
    weighting the pseudo-random sequence of data values based on the second decompressed weight values; and
    transmitting the pseudo-random sequence of data values weighted based on the second decompressed weight values to a second scan chain.

14. A method according to claim 13, further comprising:
    receiving output form the scan chain and the second scan chain;
    generating a test signature based on the output; and
    determining if the test signature indicates a successful test.

15. A method according to claim 12, further comprising:
    transmitting the pseudo-random sequence of data values weighted based on the decompressed weight values to a scan chain;
    weighting the pseudo-random sequence of data values based on the decompressed weight values to generate a second weighted pseudo-random sequence of data values; and
    transmitting the second weighted pseudo-random sequence of data values to a second scan chain.

16. A method according to claim 12, further comprising:
    storing the compressed weight values in a variable-length shift register.

17. A system comprising:
    a chipset; and
    a die comprising a microprocessor in communication with the chipset, wherein the microprocessor includes a circuit comprising:
    a pseudo-random sequence generator to generate a pseudo-random sequence of data values;

a decoder to receive compressed weight values and to generate decompressed weight values; and a weighting unit to receive the pseudo-random sequence of data value, to receive the decompressed weight values and to weight the pseudo-random sequence of data values based on the decompressed weight values.

18. A system according to claim 17, the microprocessor further comprising:
 a second decoder to receive compressed weight values and to generate second decompressed weight values;
 a second weight unit to receive the pseudo-random sequence of data value, to receive the second decompressed weight values and to weight the pseudo-random sequence of data values based on the second decompressed weight values; and
 a second scan chain to receive the pseudo-random sequence of data values weighted based on the second decompressed weight values.

* * * * *